(12) United States Patent
Nguyen et al.

(10) Patent No.: US 9,231,574 B2
(45) Date of Patent: Jan. 5, 2016

(54) POWER CONVERTER, CLOCK MODULE AND ASSOCIATED CONTROL METHOD

(71) Applicant: Chengdu Monolithic Power Systems Co., Ltd., Chengdu (CN)

(72) Inventors: James Nguyen, San Jose, CA (US); Yike Li, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 18 days.

(21) Appl. No.: 14/478,957

(22) Filed: Sep. 5, 2014

(65) Prior Publication Data

US 2015/0061628 A1     Mar. 5, 2015

(30) Foreign Application Priority Data

Sep. 5, 2013   (CN) .......................... 2013 1 0399774

(51) Int. Cl.
| | |
|---|---|
| *G06F 1/00* | (2006.01) |
| *H03K 5/135* | (2006.01) |
| *H02M 3/156* | (2006.01) |
| *H03K 7/08* | (2006.01) |
| *H02M 1/00* | (2007.01) |

(52) U.S. Cl.
CPC ............. *H03K 5/135* (2013.01); *H02M 3/1563* (2013.01); *H03K 7/08* (2013.01); *H02M 2001/0019* (2013.01); *H02M 2001/0041* (2013.01); *H02M 2003/1566* (2013.01)

(58) Field of Classification Search
CPC ..... H03M 3/1588; H03M 3/3353; G05F 1/56; G05F 1/565; H03F 1/083
USPC ............ 323/222, 224, 272, 282–290; 363/17, 363/21.04, 41, 89, 97
See application file for complete search history.

(56) References Cited

U.S. PATENT DOCUMENTS

| | | | | |
|---|---|---|---|---|
| 5,635,871 A * | 6/1997 | Cavigelli | ................ | H03F 1/083 330/107 |
| 6,147,478 A * | 11/2000 | Skelton | ............... | H02M 3/1563 323/284 |
| 6,229,292 B1 * | 5/2001 | Redl | ........................ | G05F 1/565 323/224 |
| 6,798,285 B2 * | 9/2004 | Candy | ..................... | H03F 1/083 330/109 |
| 8,970,305 B1 * | 3/2015 | Aram | ....................... | H03G 5/00 330/109 |

* cited by examiner

*Primary Examiner* — Rajnikant Patel
(74) *Attorney, Agent, or Firm* — Perkins Coie LLP

(57) ABSTRACT

A power converter and a clock module employed for providing a clock signal to the power converter. The power converter converts an input voltage to an output voltage based on at least the switching on and off of a main switch. The clock module monitors a deviation of the output voltage from its desired value and compares the deviation with a predetermined threshold window to provide a clock control signal. The clock module further regulates the clock signal in response to the clock control signal.

20 Claims, 6 Drawing Sheets

POWER CONVERTER, CLOCK MODULE AND ASSOCIATED CONTROL METHOD

CROSS-REFERENCE TO RELATED APPLICATION(S)

This application claims the benefit of CN application No. 201310399774.1 filed on Sep. 5, 2013 and incorporated herein by reference.

TECHNICAL FIELD

This disclosure relates generally to power converters, and more particularly relates to switching power converters and clock module for switching power converters.

BACKGROUND

Most switching power converters are employed to convert an input voltage into an appropriate output voltage through controlling a switch module to switch on and off, thereby regulating power transmitted to a load.

However, when the load changes rapidly, the output voltage may widely vary. For instance the output voltage may drop largely if the load gets heavier and requires a larger current. In this circumstance, it is desired that the output voltage can be regulated to restore to its desired value as quickly as possible.

SUMMARY

In accomplishing the above and other objects, there has been provided, in accordance with an embodiment of the present invention, a power converter, comprising: an input port configured to receive an input voltage; an output port configured to provide an output voltage; a switch module comprising a main switch configured to switch on and off in response to a pulse width modulated signal to convert the input voltage into the output voltage; and a control module configured to receive a first feedback signal indicative of the output voltage, a second feedback signal indicative of a switching current flowing through the switch module, and a reference signal indicative of a desired value of the output voltage. The control module may be configured to provide an off trigger signal based on the first feedback signal, the second feedback signal and the reference signal. The control module may further be configured to monitor a deviation of the output voltage from its desired value and compare the deviation of the output voltage with a first predetermined threshold window to generate a clock control signal, wherein the clock control signal is configured to control the generation of a clock signal. Based on the off trigger signal and the clock signal, the control module may further be configured to provide the pulse width modulated signal based on the off trigger signal and the clock signal, wherein the pulse width modulated signal is configured to drive the main switch to switch on in response to the clock signal, and wherein the pulse width modulated signal is configured to drive the main switch to switch off in response to the off trigger signal.

There has also been provided, in accordance with an embodiment of the present invention, a clock module for providing a clock signal to a power converter, wherein the power converter comprises a main switch configured to switch on and off in response to a pulse width modulated signal to convert an input voltage to an output voltage. The clock module according to an embodiment of the present invention may comprise: a clock control module configured to detect a deviation of the output voltage from its desired value, and to compare the deviation with a first predetermined threshold window to generate a clock control signal; and a clock generation module configured to generate the clock signal, and further configured to receive the clock control signal and to regulate the clock signal in response to the clock control signal.

There has also been provided, in accordance with an embodiment of the present invention, a method for controlling a power converter, wherein the power converter comprising a main switch configured to switch on and off to convert an input voltage to an output voltage. The method according to an embodiment of the present invention may comprise: monitoring a deviation of the output voltage from its desired value, and comparing the deviation with a first predetermined threshold window to generate a clock control signal; regulating a clock signal of the power converter based on the clock control signal; and switching the main switch on based on pulses of the clock signal.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
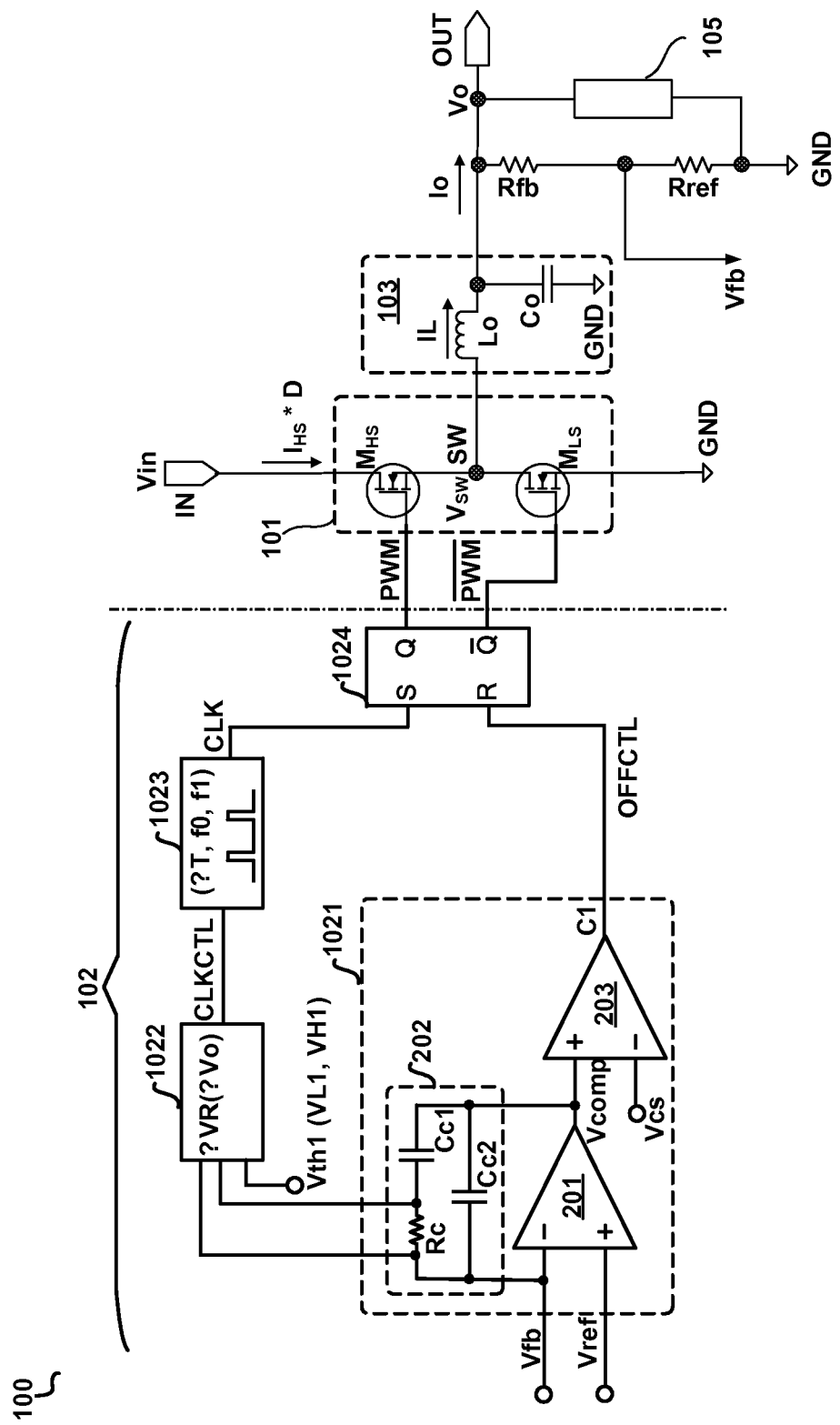
FIG. 1 illustrates a block diagram of a power converter 100 in accordance with an embodiment of the present invention.

FIG. 1 illustrates a block diagram of a power converter 100 in accordance with an embodiment of the present invention. The power converter 100 may comprise: an input port IN configured to receive an input voltage Vin; an output port OUT configured to provide an output voltage Vo and an output current Io for supplying a load 105; a switch module 101; and a control module 102. The switch module 101 may at least comprise a main switch (e.g. the main switch $M_{HS}$ illustrated in FIG. 1). The switch module 101 may have a first terminal coupled to the input port IN, a second terminal coupled to the output port OUT and a control terminal configured to receive a pulse width modulated signal PWM the switch module is configured to conduct on and off switching based on the pulse width modulated signal PWM to convert the input voltage Vin into the output voltage Vo. The control module 102 may comprise a first control input terminal, a second control input terminal, a third control input terminal and a first control output terminal, wherein the first control input terminal is configured to monitor/receive a first feedback signal Vfb indicative of the output voltage Vo, the second control input terminal is configured to monitor/receive a second feedback signal Vcs indicative of the output current Io, the third control input terminal is configured to receive a reference signal Vref indicative of a desired value of the output voltage Vo. The control module 102 is configured to provide the pulse width modulated signal PWM at the first control output terminal based at lease on the first feedback signal Vfb, the second feedback signal Vcs and the reference signal Vref.

In accordance with the exemplary embodiment of FIG. 1, the switch module 101 of the power converter 100 may further comprise a second switch $M_{LS}$. The main switch $M_{HS}$ and the second switch $M_{LS}$ are coupled in series between the input port IN and a reference ground GND, and the common connection of the main switch $M_{HS}$ and the second switch $M_{LS}$ forms a switching node SW which can be considered as the second terminal of the switch module 101. The main switch $M_{HS}$ may comprise a controllable switching device, e.g. illustrated as a MOSFET in FIG. 1. The second switch $M_{LS}$ may also comprise a controllable switching device, e.g. illustrated as a MOSFET in FIG. 1. In the embodiment where the second switch $M_{LS}$ comprises the controllable switching device, the control module 102 may further comprise a second control output terminal configured to provide a second pulse width modulated signal $\overline{PWM}$ to the switch module 101 to drive the second switch $M_{LS}$, wherein the second pulse width modulated signal $\overline{PWM}$ is an logic complementary signal to the pulse width modulated signal PWM. In other embodiment, the second switch $M_{LS}$ may comprise a diode in stead of a MOSFET. In this case, the control module 102 does not provide the second pulse width modulated signal $\overline{PWM}$. With the control of the control module 102, the main switch $M_{HS}$ and the second switch $M_{LS}$ are driven to switch on and off complementarily, i.e. when the main switch $M_{HS}$ is switched on, the second switch $M_{LS}$ is switched off, and vice versa. The switch module 101 provides a switching signal $V_{SW}$ at the switching node SW.

In accordance with an embodiment of the present invention, the power converter 100 may further comprise a filtering module 103. The filtering module 103 is coupled to the input port IN when the main switch $M_{HS}$ is on to store energy, and is coupled to the output port OUT when the main switch $M_{HS}$ is off to deliver energy to the load 105. In the example of FIG. 1, the filtering module 103 is illustrated to comprise an inductive power storage device Lo and a capacitive power storage device Co. The inductive power storage device Lo is at least coupled to the switch module 101, for instance, in the embodiment of FIG. 1, a first terminal of the inductive power storage device Lo is coupled to the switch node SW of the switch module 101, a second terminal of the inductive power storage device Lo is coupled to the output port OUT. When the main switch $M_{HS}$ is on, the inductive power storage device Lo is connected to the input port IN to store energy. When the main switch $M_{HS}$ is off, the inductive power storage device Lo is disconnected from the input port IN, and is connected to the output port OUT to discharge energy. An inductor current IL is generated and flows through the inductive power storage device Lo during the storage and discharge of energy. The capacitive power storage device Co has a first terminal coupled to the output port OUT and a second terminal connected to the reference ground GND and is configured to filter the output signal (e.g. the switching signal $V_{SW}$) of the switch module 101 to provide the smoothed output voltage Vo. The exemplary embodiment of the power converter 100 shown in FIG. 1 is based on buck (step-down) type converter topology and may be referred to as a buck (step down) power converter. One of ordinary skill in the art should understand that the circuits and method taught herein may apply to other types of converter, such as boost (step-up) power converter, buck-boost power converter, flyback power converter etc.

In accordance with an embodiment of the present invention, the power converter 100 may further comprise a feedback module, which is configured to monitor the output voltage Vo and to provide the feedback signal Vfb. For instance, in the example of FIG. 1, the feedback module is illustrated to comprise a first feedback resistor Rfb and a second feedback resistor Rref connected in series between the output port OUT and the reference ground GND. The feedback signal Vfb is provided from the common connection of the first feedback resistor Rfb and the second feedback resistor Rref. In other embodiments, the feedback module may comprise other circuit elements. In certain embodiment, the power converter 100 may not comprise the feedback module and the output voltage Vo may be provided as the feedback signal Vfb.

In accordance with an embodiment of the present invention, the control module 102 is configured to perform peak current control pulse width modulation mode to control the on and off switching of the switch module 101. In an embodiment, the control module 102 is configured to at least provide a pulse width modulated signal PWM to the main switch $M_{HS}$ of the switch module 101 to control the on and off switching of the main switch $M_{HS}$. A fraction of time that the main switch $M_{HS}$ is switched on during the total time of an on and off switching cycle may be referred to as an on duty cycle of the switch module 101 or the power converter 100, denoted by D for example. The control module 102 regulates the output voltage Vo through regulating the duty cycle D. In peak current control pulse width modulation mode. The second feedback signal Vcs may be provided through sensing a switching current $I_{HS}$ flowing through the main switch $M_{HS}$ or the inductor current $I_L$ flowing through the inductive power storage device Lo. Therefore, the second feedback signal Vcs is proportional to the switching current $I_{HS}$ or the inductor current $I_L$ and carries information of a peak value of the switching current $I_{HS}$ or the inductor current $I_L$. Since the output current Io can be considered as an average of the switching current $I_{HS}$ or the inductor current $I_L$, the switching current $I_{HS}$ or the inductor current $I_L$ is actually indicative of the output current Io.

The power converter 100 and the control module 102 will be described in more detail with reference to FIGS. 1-8 in the following.

In accordance with an embodiment of the present invention, the control module 102 operating with peak current control pulse width modulation mode is configured to operate the first feedback signal Vfb with the reference signal to provide a difference signal Vcomp indicative of a difference between the first feedback signal Vfb and the reference signal Vref, and to compare the second feedback signal Vcs with the difference signal Vcomp to provide a first comparison signal C1. The control module 102 is further configured to monitor a deviation ΔVo of the output voltage Vo from its desired value, and to compare the deviation ΔVo with a first predetermined threshold window Vth1 to generate a clock control signal CLKCTL, wherein the clock control signal CLKCTL is configured to control the generation of a system clock signal CLK. The control module 102 is further configured to provide the first comparison signal C1 as an off trigger signal OFFCTL, and to generate the pulse width modulated signal PWM based on the off trigger signal OFFCTL and the clock signal CLK, wherein the pulse width modulated signal PWM is configured to drive the main switch $M_{HS}$ to switch on in response to the clock signal CLK, and to drive the main switch $M_{HS}$ to switch off in response to the off trigger signal OFFCTL. In accordance with an exemplary embodiment of the present invention, for each switching cycle, the clock signal CLK is configured to set the beginning of a pulse of the pulse width modulated signal PWM while the off trigger signal OFFCTL is configured to set the end of the pulse of the pulse width modulated signal PWM. In this way, the pulse width of the pulse width modulated signal PWM is regulated cycle by cycle. In an embodiment, the pulse width modulated signal PWM is configured to drive the main switch $M_{HS}$ to maintain on within the pulse duration of the pulse width modulated signal PWM, and to drive the main switch $M_{HS}$ to maintain off hors the pulse duration of the pulse width modulated signal PWM. In this circumstance, the pulse width modulated signal PWM is actually configured to switch the main switch $M_{HS}$ on every time a pulse of the clock signal CLK comes, and switch the main switch $M_{HS}$ off every time a pulse of the off trigger signal OFFCTL comes. Therefore, the main switch $M_{HS}$ is switched on and off periodically to regulate the duty cycle D of each switching cycle so as to regulate the output voltage Vo.

In accordance with an embodiment of the present invention, once the control module 102 detects that the deviation ΔVo of the output voltage Vo from its desired value exceeds the first predetermined threshold window Vth1, the control module 102 is configured to reset the clock signal CLK based on the clock control signal CLKCTL. That is to say, once the deviation ΔVo exceeds the first predetermined threshold window Vth1, the clock control signal CLKCTL immediately triggers the control module 102 to reset the clock signal CLK, i.e. to make the clock signal CLK to generate an initial pulse immediately, despite the current status of the clock signal CLK. The first predetermined threshold window Vth1 is indicative of an allowable vibration margin of the output voltage Vo under normal operation of the power converter 100 and can be selected according to practical application requirements. Thus, if the output voltage Vo vibrates largely, e.g. due to rapid change of the load 105 (for instance, the output voltage Vo may drop largely if the load 105 gets heavier and requires larger output current Io), the control module 102 may detect and determine that the deviation ΔVo has exceeded the first predetermined threshold window Vth1 and thus reset the clock signal CLK immediately. In consequence, the reset clock signal CLK immediately triggers the pulse width modulated signal PWM to switch the main switch $M_{HS}$ on and switch the second switch $M_{LS}$ off, so as to source enough current (or energy) to the load 105 to regulate the output voltage Vo to restore to its desired steady state value rapidly.

In accordance with an embodiment of the present invention, once the control module 102 detects that the deviation ΔVo of the output voltage Vo from its desired value exceeds the first predetermined threshold window Vth1, the control module 102 may further be configured to vary a frequency of the clock signal CLK during a predetermined duration ΔT. In accordance with an embodiment of the present invention, the control module 102 may be configured to reset the clock signal CLK and in meanwhile to vary the frequency of the clock signal CLK during the predetermined duration ΔT based on the clock control signal CLKCTL once the deviation ΔVo exceeds the first predetermined threshold window Vth1. The variation of the frequency of the clock signal CLK may be implemented in a variety of fashions. For instance, in an embodiment, the clock signal CLK may have a first frequency (normal frequency) f0 when the power converter 100 is in normal operation. Once the control module 102 detects that the deviation ΔVo has exceeded the first predetermined threshold window Vth1, the clock control signal CLKCTL is configured to immediately trigger the frequency of the clock signal CLK to increase to a second frequency f1, and to maintain at the second frequency in said predetermined duration ΔT. At the end of the predetermined duration ΔT, the frequency of the clock signal CLK is restored to the first frequency f0. In an embodiment, once the control module 102 detects that the deviation ΔVo has exceeded the first predetermined threshold window Vth1, the clock control signal CLKCTL is configured to immediately trigger the frequency of the clock signal CLK to increase to the second frequency f1, and then to gradually decrease from the second frequency f1 to the first frequency f0 throughout the predetermined duration ΔT. At the end of the predetermined duration ΔT, the frequency of the clock signal CLK is restored to the first frequency f0. As described in these two exemplary embodiments, increasing the frequency of the clock signal CLK may also be benefit to the restoration of the output voltage Vo to its desired steady state value rapidly. This is because once the frequency of the clock signal CLK is increased, which implies that the pulse width modulated signal PWM can the main switch $M_{HS}$ to switch on with the increased frequency, more current (energy) can be transmitted to the load 105 within the predetermined duration ΔT to meet the need of a larger output current Io due to abrupt load variation. However, this is not intended to be limiting. One of ordinary skill in the art should understand that the control module 102 may control the frequency of the clock signal CLK to vary in other fashions so as to meet the requirement of the load 105 and to regulate the output voltage Vo to restore to its desired steady state value rapidly.

In accordance with the exemplary embodiment of FIG. 1, the control module 102 may comprise a pulse width modulation module 1021, a clock module and a logic control module 1024. Referring to FIG. 1, the clock module is illustrated as to comprise a clock control module 1022 and a clock generation module 1023.

Figure 2:
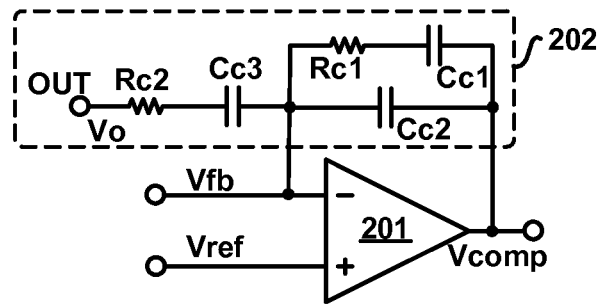
FIG. 2 illustrates a schematic diagram of a compensation module 202 according to an alternative exemplary embodiment of the present invention.

In accordance with an embodiment of the present invention, the pulse width modulation module 1021 may be configured to receive the first feedback signal Vfb, the reference signal Vref and the second feedback signal Vcs, and is configured to provide the off trigger signal OFFCTL. In an exemplary embodiment, the pulse width modulation module 1021 may be configured to operate the first feedback signal Vfb with the reference signal Vref to provide the difference signal Vcomp indicative of the difference between the first feedback signal Vfb and the reference signal Vref, and to compare the difference signal Vcomp with the second feedback signal to provide the first comparison signal as the off trigger signal OFFCTL. In FIG. 1, the pulse width modulation module 1021 may exemplarily comprise an operational amplifier 201, a compensation circuit 202 and a PWM comparator 203. The operational amplifier 201 may have a first amplifier input terminal (e.g. the "−" input terminal illustrated in FIG. 1) configured to receive the first feedback signal Vfb, a second amplifier input terminal (e.g. the "+" input terminal illustrated in FIG. 1) configured to receive the reference signal Vref, and an amplifier output terminal configured to provide the difference signal Vcomp. The compensation circuit 202 may be coupled between the first amplifier input terminal and the amplifier output terminal and configured to provide integral compensation to the output signal Vcomp of the operational amplifier 201. In the example of FIG. 1, the compensation circuit 202 is illustrated as to comprise a first compensation resistor Rc1 and a first compensation capacitor Cc1 coupled in series between the first amplifier input terminal and the amplifier output terminal, and a second compensation capacitor Cc2 coupled in parallel with the first compensation resistor Rc1 and the first compensation capacitor Cc1. The compensation circuit 202 illustrated in FIG. 1 may be referred to as type II compensation circuit. In an embodiment, the compensation circuit 202 may not comprise the second compensation capacitor Cc2. In this case, the compensation circuit 202 may be referred to as type I compensation circuit. In an alternative embodiment, besides the first compensation resistor Rc1, the first compensation capacitor Cc1 and the second compensation capacitor Cc2 shown in FIG. 1, the compensation circuit 202 may further comprise a second compensation resistor Rc2 and a third compensation capacitor Cc3 as illustrated in FIG. 2. The second compensation resistor Rc2 and the third compensation capacitor Cc3 may be coupled in series between the first amplifier input terminal and the amplifier output terminal. The compensation circuit 202 in this circumstance may be referred to as type III compensation circuit. The PWM comparator 203 may have a first comparator input terminal (the "−" input terminal in FIG. 1) configured to receive the second feedback signal Vcs, a second comparator input terminal (the "+" input terminal in FIG. 1) configured to receive the difference signal Vcomp and a comparator output terminal configured to provide the first comparison signal C1.

In accordance with an embodiment of the present invention, the clock module (e.g. comprising the clock control module 1022 and the clock generation module 1023) may be configured to provide the system clock signal CLK to the power converter 100. The frequency of the clock signal CLK may determine the operating frequency of the power converter 100. In accordance with an exemplary embodiment, the clock module may be configured to monitor the deviation ΔVo of the output voltage Vo from its desired value, and to compare the deviation ΔVo with the first predetermined threshold window Vth1 to generate the clock control signal CLKCTL, and to generate and regulate the clock signal CLK based on the clock control signal CLKCTL.

In accordance with an embodiment of the present invention, still referring to FIG. 1, the clock control module 1022 may be configured to detect the deviation ΔVo of the output voltage Vo from its desired value, and to compare the deviation ΔVo with the first predetermined threshold window Vth1 to generate the clock control signal CLKCTL. In the example of FIG. 1, the clock control module 1022 is electrically coupled to the first compensation resistor Rc1 of the compensation circuit 202 and is configured to detect a voltage drop on the first compensation resistor Rc1 to provide a voltage detection signal ΔVR (referring FIG. 1 and FIG. 3), wherein the voltage detection signal ΔVR can actually represent the deviation ΔVo of the output voltage Vo from its desired value. One of ordinary skill in the art can understand that the compensation circuit 202 may always comprise the first compensation resistor Rc1 no matter the type I, or type II or type III compensation is applied. Therefore, it is easy and practical to monitor the deviation ΔVo through detecting the voltage drop on the first compensation resistor Rc1. In accordance with an embodiment of the present invention, the clock control signal CLKCTL may have a trigger logic state (e.g. a high logic state or a high logic pulse) when the deviation ΔVo is detected to have exceeded the first predetermined threshold window Vth1, and have a non-trigger logic state (e.g. a low logic state) when the deviation ΔVo is detected to be within the first predetermined threshold window Vth1. In an embodiment, the clock control signal CLKCTL may be configured to trigger the clock generation module 1023 to reset the clock signal CLK once the clock control signal CLKCTL is at the trigger logic state. If the clock control signal CLKCTL remains at the non-trigger logic state, it does not trigger the clock generation module 1023. In an exemplary embodiment, the clock control signal CLKCTL may further be configured to trigger the clock generation module 1023 to vary the frequency of the clock signal CLK during the predetermined duration ΔT, e.g. to immediately increase the frequency of the clock signal CLK from the first frequency f0 to the second frequency f1 once the clock control signal CLKCTL is at the trigger logic state, and to regulate the frequency of the clock signal CLK to maintain the second frequency f1 during the predetermined duration ΔT and to change back to the first frequency f0 at the end of the predetermined duration ΔT. In accordance with an exemplary embodiment of the present invention, the first predetermined threshold window Vth1 may comprise a first low threshold VL1 and a first high threshold VH1, wherein the first high threshold VH1 is higher than the first low threshold VL1, and wherein the first predetermined threshold window Vth1 is a range higher than the first low threshold VL1 and lower than the first high threshold VH1. Thus, in this exemplary embodiment, if the deviation ΔVo is smaller than the first low threshold VL1 or larger than the first high threshold VH1, it is determined that the deviation ΔVo has exceeded the first predetermined threshold window Vth1. Otherwise, it is determined that the deviation ΔVo is within the first predetermined threshold window Vth1. However, one of ordinary skill in the art should understand that this is not intended to be limiting. For instance, in other embodiments, the first predetermined threshold window Vth1 may be set to a predetermined value, e.g. to the first high threshold VH1. In this circumstance, the first low threshold VL1 may be considered to have the reference ground GND potential. Therefore, in this example, the deviation ΔVo is determined to have exceeded the first predetermined threshold window Vth1 once it is larger than the first high threshold VH1. Otherwise, it is determined to be within the first predetermined threshold window Vth1.

In accordance with an exemplary embodiment of the present invention, still referring to FIG. 1, the clock generation module 1023 is configured to receive the clock control signal CLKCTL and to regulate the clock signal CLK in response to the clock control signal CLKCTL. In an embodiment, if the clock control signal CLKCTL is at the trigger logic state, the clock generation module 1023 is configured to reset the clock signal CLK in response to the trigger logic state of the clock control signal CLKCTL. If the clock control signal CLKCTL is at the non-trigger logic state, the clock generation module 1023 is configured not to change the clock signal CLK. In an alternative embodiment, if the clock control signal CLKCTL is at the trigger logic state, the clock generation module 1023 is configured to reset the clock signal in response to the trigger logic state and in meanwhile to increase the frequency of the clock signal CLK from the first frequency f0 to the second frequency f1, and to regulate the frequency of the clock signal CLK to maintain at the second frequency f1 during the predetermined duration ΔT, and to restore at the first frequency f0 at the end of the predetermined duration ΔT. In an alternative embodiment, if the clock control signal CLKCTL is at the trigger logic state, the clock generation module 1023 is configured to reset the clock signal in response to the trigger logic state and in meanwhile to increase the frequency of the clock signal CLK from the first frequency f0 to the second frequency f1, and to regulate the frequency of the clock signal CLK to gradually decrease from the second frequency f1 to the first frequency f0 during the predetermined duration ΔT so that the frequency of the clock signal is restored to the first frequency f0 at the end of the predetermined duration ΔT.

In accordance with an exemplary embodiment of the present invention, still referring to FIG. 1, the logic control module 1024 is configured to receive the off trigger signal OFFCTL and the clock signal CLK, and to generate the pulse width modulated signal PWM based on the off trigger signal OFFCTL and the clock signal CLK, wherein the logic control module 1024 is configured to set the pulse width modulated signal PWM to a first logic state (e.g. high logic state) in response to each pulse of the clock signal CLK, and to set the pulse width modulated signal PWM to a second logic state (e.g. low logic state) in response to each pulse of the off trigger signal OFFCTL. In an embodiment, the pulse width modulated signal PWM is configured to drive the main switch $M_{HS}$ to switch on when the pulse width modulated signal PWM is at the first logic state, and to drive the main switch $M_{HS}$ to switch off when the pulse width modulated signal PWM is at the second logic state. In the example of FIG. 1, the logic control module 1024 may comprise an RS flip-flop circuit having a set input terminal S configured to receive the clock signal CLK, a reset input terminal R configured to receive the off trigger signal OFFCTL, a first flip-flop output terminal Q configured to provide the pulse width modulated signal PWM, and a second flip-flop output terminal $\overline{Q}$ configured to provide the second pulse width modulated signal $\overline{PWM}$. The second pulse width modulated signal $\overline{PWM}$ is logically complementary with the pulse width modulated signal PWM, i.e. when the pulse width modulated signal PWM is at the first logic state, the second pulse width modulated signal $\overline{PWM}$ is at the second logic state, when the pulse width modulated signal PWM is at the second logic state, the second pulse width modulated signal $\overline{PWM}$ is at the first logic state. In the embodiment of FIG. 1, the second pulse width modulated signal $\overline{PWM}$ is configured to drive the second switch $M_{LS}$ to switch on and off complementarily with the main switch $M_{HS}$. However, this is not intended to be limiting. For example, in an alternative embodiment, the logic control module 1024 may not provide the second pulse width modulated signal $\overline{PWM}$ when the second switch $M_{LS}$ is a freewheeling diode.

Figure 3:
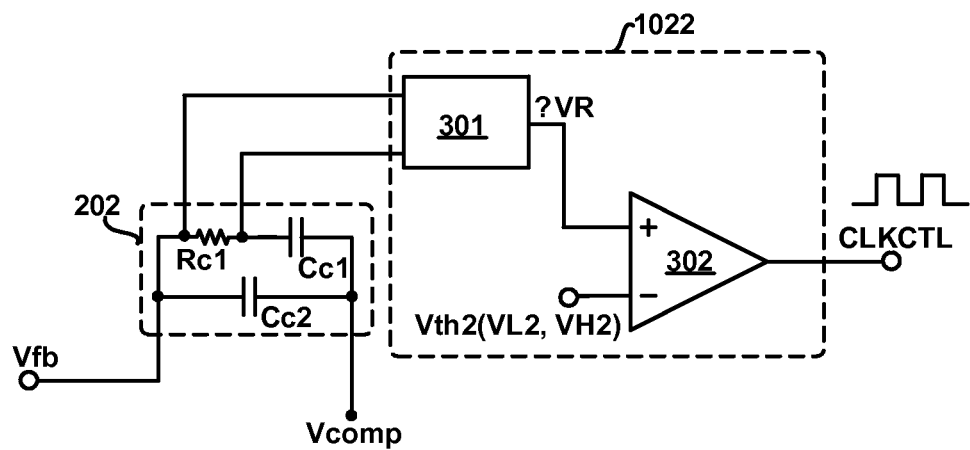
FIG. 3 illustrates a schematic diagram of a clock control module 1022 in accordance with an embodiment of the present invention.

FIG. 3 illustrates a schematic diagram of the clock control module 1022 in accordance with an embodiment of the present invention. In this exemplary embodiment, the clock control module 1022 may comprise a voltage detection circuit 301 and a clock control comparator 302. The voltage detection circuit 301 may have a first detection input terminal, a second detection input terminal and a detection output terminal, wherein the first detection input terminal is coupled to a first terminal of the first compensation resistor Rc1, the second detection input terminal is coupled to a second terminal of the first compensation resistor Rc1, and wherein the voltage detection circuit 301 is configured to detect the voltage drop on the first compensation resistor Rc1 based on the signals detected at the first detection input terminal and the second detection input terminal so as to provide the voltage detection signal ΔVR indicative of the deviation ΔVo. The voltage detection signal ΔVR in this embodiment may be expressed by ΔVR≈K*ΔVo, wherein the coefficient K is related to the resistance of the compensation resistor Rc1 and a detection gain of the voltage detection circuit 301 etc. The voltage detection circuit 301 may comprise any suitable circuits/modules that can detect the voltage drop across the first compensation resistor Rc1 or can detect the voltages at the first and the second terminals of first compensation resistor Rc1 and then calculate the voltage drop. Such circuits/modules are well known to those skilled in the art and are thus not addressed in detail in the present disclosure. The clock control comparator 302 may have a first comparator input terminal (e.g. the "+" input terminal in FIG. 3), a second comparator input terminal (e.g. the "−" input terminal in FIG. 3) and a comparator output terminal, wherein the first comparator input terminal is configured to receive the voltage detection signal ΔVR, the second comparator input terminal is configured to receive a second predetermined threshold window Vth2, and wherein the clock control comparator 302 is configured to compare the voltage detection signal ΔVR with the second predetermined threshold window Vth2 to provide the clock control signal CLKCTL. In accordance with an exemplary embodiment, the clock control signal CLKCTL may have the trigger logic state (e.g. high logic state or high logic pulse) when the voltage detection signal ΔVR exceeds the second predetermined threshold window Vth2, and have the non-trigger logic state (e.g. low logic state) when the voltage detection signal ΔVR is within the second predetermined threshold window Vth2. In accordance with an exemplary embodiment, the clock control signal CLKCTL may be a pulse trigger signal. That is to say, once the voltage detection signal exceeds the second predetermined threshold window Vth2, the clock control signal CLKCTL is configured to generate a pulse to trigger the clock generation module 1023 to reset the clock signal CLK and/or vary the frequency of the clock signal CLK.

The second predetermined threshold window Vth2 is indicative of the first predetermined threshold window Vth1.

In an embodiment, the second predetermined threshold window Vth2 may be proportional to the first predetermined threshold window Vth1 with the coefficient K, i.e. Vth2≈K*Vth1. As has been described above, the first predetermined threshold window Vth1 is indicative of an allowable vibration margin of the output voltage Vo under normal operation of the power converter 100. Therefore, both the first predetermined threshold window Vth1 and the second predetermined threshold window Vth2 directly or indirectly indicate allowable vibration margin of the output voltage Vo. In accordance with an embodiment of the present invention, the second predetermined threshold window Vth2 may comprise a second low threshold VL2 and a second high threshold VH2, wherein the second high threshold VH2 is higher than the second low threshold VL2, and wherein the first predetermined threshold window Vth2 is a range higher than the second low threshold VL2 and lower than the second high threshold VH2. In an exemplary embodiment, the second low threshold VL2 and the second high threshold VH2 may respectively be proportional to the first low threshold VL1 and the first high threshold VH1 with the coefficient K. Thus, in this exemplary embodiment, if the voltage detection signal ΔVR is smaller than the second low threshold VL2 or larger than the second high threshold VH2, it is determined that the voltage detection signal ΔVR has exceeded the second predetermined threshold window Vth2. Otherwise, it is determined that the voltage detection signal ΔVR is within the second predetermined threshold window Vth2. However, one of ordinary skill in the art should understand that this is not intended to be limiting. For instance, in other embodiments, the second predetermined threshold window Vth2 may be set to a predetermined value, e.g. to the second high threshold VH2, corresponding to the example where the first predetermined threshold window Vth1 is set to the first high threshold VH1. In this circumstance, the second low threshold VL2 may be considered to have the reference ground GND potential. Therefore, in this example, the voltage detection signal ΔVR is determined to have exceeded the second predetermined threshold window Vth2 once it is larger than the second high threshold VH2, and the clock control signal CLKCTL is thus set to the trigger logic state. Otherwise, it is determined that the voltage detection signal ΔVR is within the second predetermined threshold window Vth2, and the clock control signal CLKCTL is at the non-trigger logic state.

Figure 4:
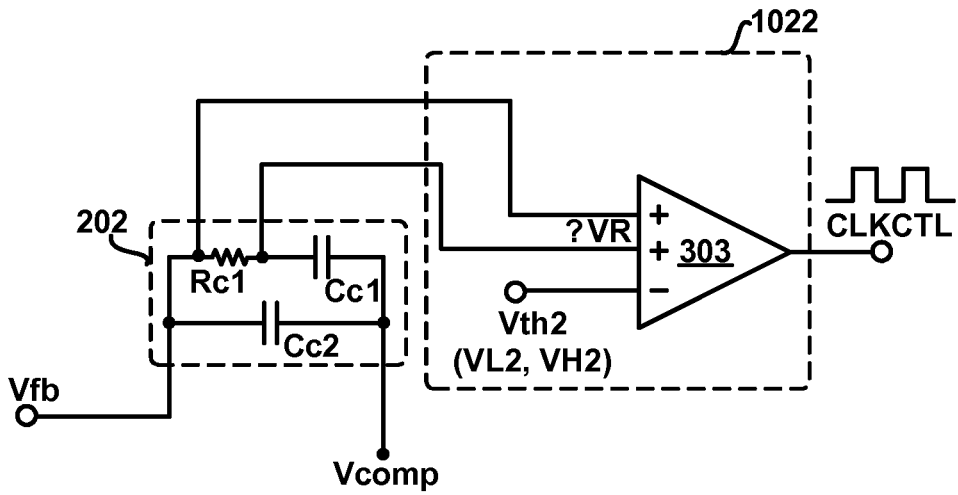
FIG. 4 illustrates a schematic diagram of a clock control module 1022 in accordance with an alternative embodiment of the present invention.

One of ordinary skill in the art should understand that the clock control module 1022 and the clock generation module 1023 described above with reference to FIG. 3 are illustrative and not limiting, various modifications may be made without departing from the spirit of the present invention. For instance, FIG. 4 illustrates a schematic diagram of a clock control module 1022 in accordance with an alternative embodiment of the present invention. In the embodiment of FIG. 4, the clock control module 1022 may not comprise an independent voltage detection circuit (such as the independent voltage detection circuit 301), but may comprise a comparison circuit 303 that integrates a voltage detection function to replace the combination of the voltage detection circuit 301 and the clock control comparator 302 of FIG. 3. As shown in FIG. 4, the comparison circuit 303 may have a first comparison input terminal (e.g. the first "+" input terminal in FIG. 4), a second comparison input terminal (e.g. the second "+" input terminal in FIG. 4), a third comparison input terminal (e.g. the "−" input terminal in FIG. 4) and a comparison output terminal, wherein the first comparison input terminal is coupled to the first terminal of the first compensation resistor Rc1, the second comparison input terminal is coupled to the second terminal of the first compensation resistor Rc1, the third comparison input terminal is configured to receive the second predetermined threshold window Vth2, and the output terminal is configured to provide the clock control signal CLKCTL. The comparison circuit 303 of FIG. 4 directly monitors the voltages at both the first and the second terminals of the first compensation resistor Rc1 to provide the voltage detection signal ΔVR representing the voltage drop across the first compensation resistor Rc1, and compares the voltage detection signal ΔVR with the second predetermined threshold window Vth2 so as to provide the clock control signal CLKCTL.

Figure 5:
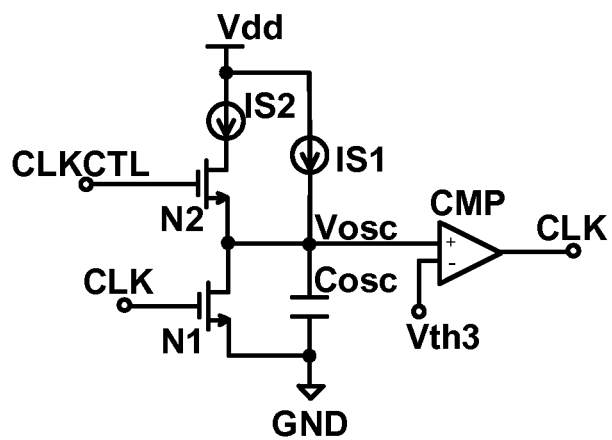
FIG. 5 illustrates a schematic block diagram of a clock generation module 1023 in accordance with an embodiment of the present invention.

FIG. 5 illustrates a schematic block diagram of the clock generation module 1023 in accordance with an embodiment of the present invention. The clock generation module 1023 may comprise a first current source IS1, an oscillation capacitor Cosc, an oscillation comparator CMP, and a first oscillation switch N1. The first current source IS1 is configured to provide a first constant current (also labeled with IS1). The oscillation capacitor Cosc may have a first capacitor terminal and a second capacitor terminal, wherein the first capacitor terminal is coupled to the first current source IS1 to receive the first constant current, the second capacitor terminal is connected to the reference ground GND. The oscillation comparator CMP may have a first comparator input terminal (e.g. the "+" input terminal in FIG. 5), a second comparator input terminal (e.g. the "−" input terminal in FIG. 5) and a comparator output terminal, wherein the first comparator input terminal is electrically coupled to the first capacitor terminal to detect a capacitor voltage Vosc at the first capacitor terminal of the oscillation capacitor Cosc, the second comparator input terminal is configured to receive a comparison threshold Vth3, the oscillation comparator CMP is configured to compare the capacitor voltage with the comparison threshold Vth3 to provide the clock signal CLK. The first oscillation switch N1 may have a first switch terminal, a second switch terminal and a switch control terminal, wherein the first switch terminal is electrically coupled to the first capacitor terminal of the oscillation capacitor Cosc, the second switch terminal is connected to the reference ground GND, and the switch control terminal is electrically coupled to the comparator output terminal of the oscillation comparator CMP to receive the clock signal CLK, and wherein the first oscillation switch N1 is driven to switch on when the clock signal CLK is at high logic level, and is driven to switch off when the clock signal CLK is at low logic level. In an exemplary embodiment, the first oscillation switch N1 may comprise a first N channel transistor (e.g. an N-channel MOSFET) having a gate operated as the switch control terminal, a drain operated as the first switch terminal and a source operated as the second switch terminal. In the example of FIG. 5, the first current source IS1, the oscillation capacitor Cosc, the oscillation comparator CMP and the first oscillation switch N1 actually constitutes an oscillation module of the clock generation module 1023. The oscillation module may be viewed as a fundamental of the clock generation module 1023 and is configured to generate the clock signal CLK with the first frequency f0 (i.e. the oscillation module determines the first frequency f0 which is also the normal operation frequency of the power converter 100 in steady state), wherein the first frequency f0 may be set by properly choosing the capacitance of the oscillation capacitor Cosc and the first constant current of the first current source IS1. However, one of ordinary skill in the art should understand that this is not intended to be limiting, the oscillation module may comprise other suitable components and may be modified according to practical requirements. One of ordinary skill in the art would also understand that the clock generation module 1023 may generally be powered by an internal voltage Vdd provided by other internal module of the power converter 100. The internal voltage Vdd may be steady and have a relatively low level (e.g. 5V or 3V etc.), which is more suitable for powering low-voltage internal devices of the power converter 100, compared to the input voltage Vin.

Continuing with FIG. 5, the clock generation module 1023 may further comprise a clock reset module. In the exemplary embodiment of FIG. 5, the clock reset module may comprise a second current source IS2 and a second oscillation switch N2. The second current source IS2 is configured to provide a second constant current (also labeled with IS2), wherein the second constant current may be larger than the first constant current. The second oscillation switch N2 may have a third switch terminal, a fourth switch terminal and a second switch control terminal, wherein the third switch terminal is electrically coupled to the second current source IS2 to receive the second constant current, the fourth switch terminal is electrically coupled to the first capacitor terminal of the oscillation capacitor Cosc, and the second switch control terminal is configured to receive the clock control signal CLKCTL. When the clock control signal CLKCTL is at the trigger logic state (e.g. high logic state or high logic pulse), the second oscillation switch N2 may be switched on and thus connecting the second current source IS2 to the first capacitor terminal of the oscillation capacitor Cosc. In this circumstance, both the first current source IS1 and the second current source IS2 charge the oscillation capacitor Cosc, making the capacitor voltage Vosc of the oscillation capacitor Cosc to rise sharply and exceed the comparison threshold Vth3 so that the comparator output terminal of the oscillation comparator CMP immediately provides a high logic pulse of the clock signal CLK in response to the clock control signal CLKCTL. Therefore, the clock signal CLK is reset immediately. When the clock control signal CLKCTL is at the non-trigger logic state (e.g. low logic state), the second oscillation switch N2 may be switched off and thus disconnecting the second current source IS2 from the first capacitor terminal of the oscillation capacitor Cosc. In an embodiment, the second oscillation switch N2 may comprise a second N channel transistor (e.g. an N-channel MOSFET) having a gate operated as the second switch control terminal, a drain operated as the third switch terminal and a source operated as the fourth switch terminal.

Figure 6:
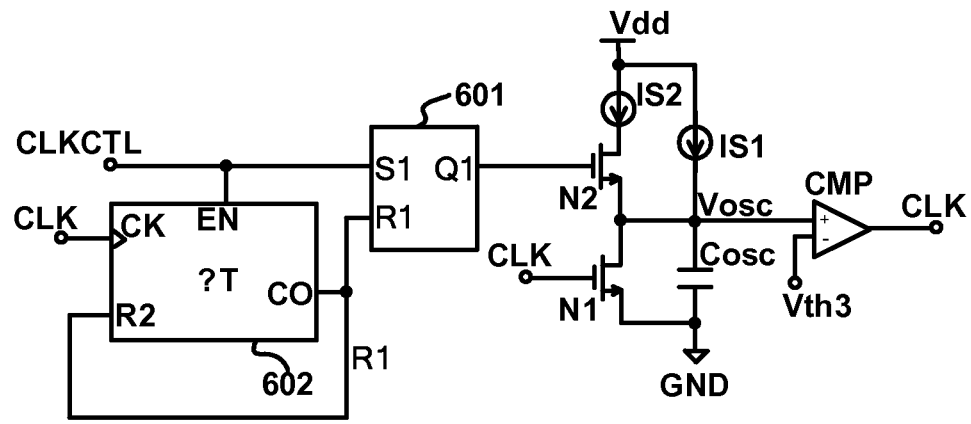
FIG. 6 illustrates a schematic block diagram of a clock generation module 1023 in accordance with an alternative embodiment of the present invention.

FIG. 6 illustrates a schematic block diagram of the clock generation module 1023 in accordance with an alternative embodiment of the present invention. Compared to the embodiment of FIG. 5, the clock generation module 1023 in the embodiment of FIG. 6 may further comprise an RS flip-flop 601 and a counter 602. The RS flip-flop 601 may have a set input terminal S1, a reset input terminal R1 and a flip-flop output terminal Q1, wherein the set input terminal S1 is configured to receive the clock control signal CLKCTL, the reset input terminal R1 is configured to receive a reset signal (also labeled with R1) provided by the counter 602, and the flip-flop output terminal Q1 is configured to provide a control signal (also labeled with Q1) to the second control terminal of the second oscillation switch N2. The counter 602 may have an enable terminal EN, a clock input terminal CK, a reset terminal R2 and an output terminal CO, wherein the enable terminal EN is configured to receive the clock control signal CLKCTL, the clock input terminal CK is configured to receive the clock signal CLK, the reset terminal R2 is coupled to the output terminal Co to receive the reset signal R1 and the output terminal CO is configured to provide the reset signal R1. With the configuration of the clock generation module 1023 shown in FIG. 6, when the clock control signal CLKCTL is at the trigger logic state, the RS flip-flop 601 is reset and the control signal Q1 may have a first logic state (e.g. a high logic state) so that the second oscillation switch N2 is switched on. When the second oscillation switch N2 is on, the second current source IS2 is connected to the first capacitor terminal of the oscillation capacitor Cosc and charges the oscillation capacitor Cosc together with the first current source IS1. Therefore, the oscillation capacitor Cosc may be charged faster, the frequency of the clock signal CLK is thus increased from the first frequency f0 to the second frequency f1. In the meanwhile, when the clock control signal CLKCTL is at the trigger logic state, the counter 602 is enabled to start counting. Once the counter 602 counts that the predetermined duration ΔT has elapsed in response to the pulses of the clock signal CLK, the reset signal R1 is generated and provided at the output terminal CO. The reset signal R1 subsequently resets the RS flip-flop 601 and the counter 602. Once the RS flip-flop 601 is reset, the control signal Q1 provided to the second oscillation switch N2 changes to a second logic state (e.g. a low logic state), driving the second oscillation switch N2 to switch off. The second current source IS2 is thus disconnected from the first capacitor terminal of the oscillation capacitor Cosc. In this way, the frequency of the clock signal CLK restores to the first frequency f0. One of ordinary skill in the art will understand that the counter 602 may be replaced with a timer in an alternative embodiment.

Figure 7:
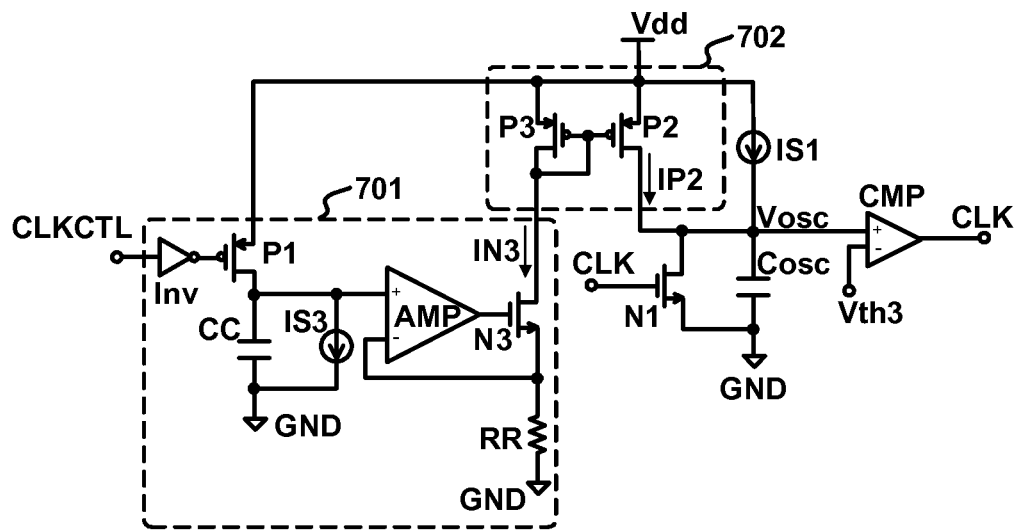
FIG. 7 illustrates a schematic block diagram of a clock generation module 1023 in accordance with an alternative embodiment of the present invention.

FIG. 7 illustrates a schematic block diagram of the clock generation module 1023 in accordance with an alternative embodiment of the present invention. Compared to the embodiment of FIG. 5, the clock generation module 1023 in the embodiment of FIG. 7 may not comprise the clock reset module (e.g. the second current source IS2 and the second oscillation switch N2). Except the oscillation module (e.g. the first current source IS1, the oscillation capacitor Cosc, the oscillation comparator CMP and the first oscillation switch N1), the clock generation module 1023 in the embodiment of FIG. 7 may further comprise a current control circuit 701 and a controllable current source 702. The configuration and working principle of the oscillation module has been described with reference to FIG. 5 and is not addressed herein. The current control circuit 701 is configured to receive the clock control signal CLKCTL and to generate a control current IN3 in response to the trigger logic state of the clock control signal CLKCTL, wherein the control current IN3 is gradually decreased from a predetermined current value (e.g. Vdd/RR in FIG. 7) to zero during the predetermined duration ΔT. The current control circuit 701 may exemplarily comprise an inverter Inv, a first P channel transistor P1, a control capacitor CC, a third current source IS3, a control amplifier AMP, a third N channel transistor N3 (e.g. a MOSFET) and a control resistor RR. The inverter Inv may have an input terminal configured to receive the clock control signal CLKCTL, and an output terminal configured to provide an inversion signal of the clock control signal CLKCTL to the gate terminal of the first P channel transistor P1. For instance, take the embodiment where the trigger logic state of the clock control signal CLKCTL is high logic state or high logic pulse, the inversion signal output from the inverter Inv is low logic state or low logic pulse when the clock control signal CLKCTL is at the trigger logic state. Thus, the first P channel transistor P1 may be driven to switch on by the inversion signal for a time interval substantially equivalent to the duration of the high logic level of the clock control signal CLKCTL and to switch off when the clock control signal CLKCTL is at the non-trigger logic state. One of ordinary skill in the art should understand that if the trigger logic state of the clock control signal CLKCTL is low logic state or low logic pulse, the inverter Inv can be omitted. The first P channel transistor P1 is configured to receive the internal voltage Vdd at its source terminal, its drain terminal is coupled to a first capacitor terminal of the control capacitor CC. A second terminal of the control capacitor CC is connected to the reference ground GND. The control capacitor CC may be charged during the time when the first P channel transistor P1 is on and the voltage at the first capacitor terminal of the control capacitor CC may reach the internal voltage Vdd. The third current source IS3 may have a first terminal electrically coupled to the first capacitor terminal of the control capacitor CC and a second terminal electrically coupled to the second capacitor terminal of the control capacitor CC, i.e. the third current source IS3 is connected in parallel with the control capacitor CC. The third current source IS3 is provided to discharge the control capacitor CC when the first P channel transistor P1 is off. The control amplifier AMP may have a first amplifier input terminal (e.g. the "+" input terminal in FIG. 7) electrically coupled to the first capacitor terminal of the control capacitor CC, a second amplifier input terminal (e.g. the "−" input terminal in FIG. 7) electrically coupled to the source terminal of the third N channel transistor N3, and an amplifier output terminal electrically coupled to the gate terminal of the third N channel transistor N3. The control resistor RR may have a first terminal electrically coupled to the source terminal of the third N channel transistor N3 and a second terminal connected to the reference ground GND. The drain terminal of the third N channel transistor N3 is configured to provide the control current IN3. The third N channel transistor N3 is operated in its linear operation area. Therefore, while the voltage at the first capacitor terminal of the control capacitor CC is discharged from the internal voltage Vdd to zero, the control current decreases from the predetermined current value to zero correspondingly. The predetermined current value can actually be determined by the internal voltage Vdd and the control resistor RR, e.g. the predetermined current value may be expressed by Vdd/RR in the example of FIG. 7. The predetermined duration ΔT may be determined by the discharging rate of the third current source IS3 to the control capacitor CC. In the example of FIG. 7, the predetermined duration ΔT may substantially be equal to the time that it takes for the voltage at the first capacitor terminal of the control capacitor CC being discharged from the internal voltage Vdd to zero.

The controllable current source 702 may exemplarily comprise a current mirror having a mirror input terminal and a mirror output terminal, wherein the mirror input terminal is configured to receive the control current IN3, and wherein the current mirror is configured to copy the control current IN3 and to provide a mirror current IP2 at the mirror output terminal. The mirror current IP2 may substantially be equal to the control current IN3. In FIG. 7, the current mirror is illustrated to comprise a second P channel transistor P2 and a third P channel transistor P3, both having a gate terminal, a source terminal and a drain terminal. The source terminals of both the second P channel transistor P2 and the third P channel transistor P3 are connected to the internal voltage Vdd. The gate terminal of the second P channel transistor P2 is connected to the gate terminal and the source terminal of the third P channel transistor P3. The source terminal of the third P channel transistor P3 is operated as the mirror input terminal to receive the control current IN3. The source terminal of the second P channel transistor P2 is operated as the mirror output terminal to provide the mirror current IP2. The first capacitor terminal of the oscillation capacitor Cosc is electrically coupled to the mirror output terminal of the controllable current source 702 to receive the mirror current IP2. Therefore, since the moment when the clock control signal CLKCTL is changed to the trigger logic state, the oscillation capacitor Cosc is charged by both the first current source IS1 and the mirror current IP2 during the predetermined duration ΔT, wherein the mirror current IP2 is gradually decreased from the predetermined current value (e.g. Vdd/RR in FIG. 7) to zero during the predetermined duration ΔT. Accordingly, in response to the trigger logic state of the clock control signal CLKCTL, the frequency of the clock signal CLK is increased from the first frequency f0 to the second frequency f1 immediately, and subsequently decreased gradually from the second frequency f1 to the first frequency f0 throughout the predetermined duration ΔT so that at the end of the predetermined duration ΔT, the frequency of the clock signal CLK is restored to the first frequency f0.

One of ordinary skill in the art should understand that the clock generation module 1023 according to the embodiments described with reference to FIGS. 5-7 is illustrative and non-exclusive. Various modifications may be made without departing from the spirit of the present invention.

Figure 8:
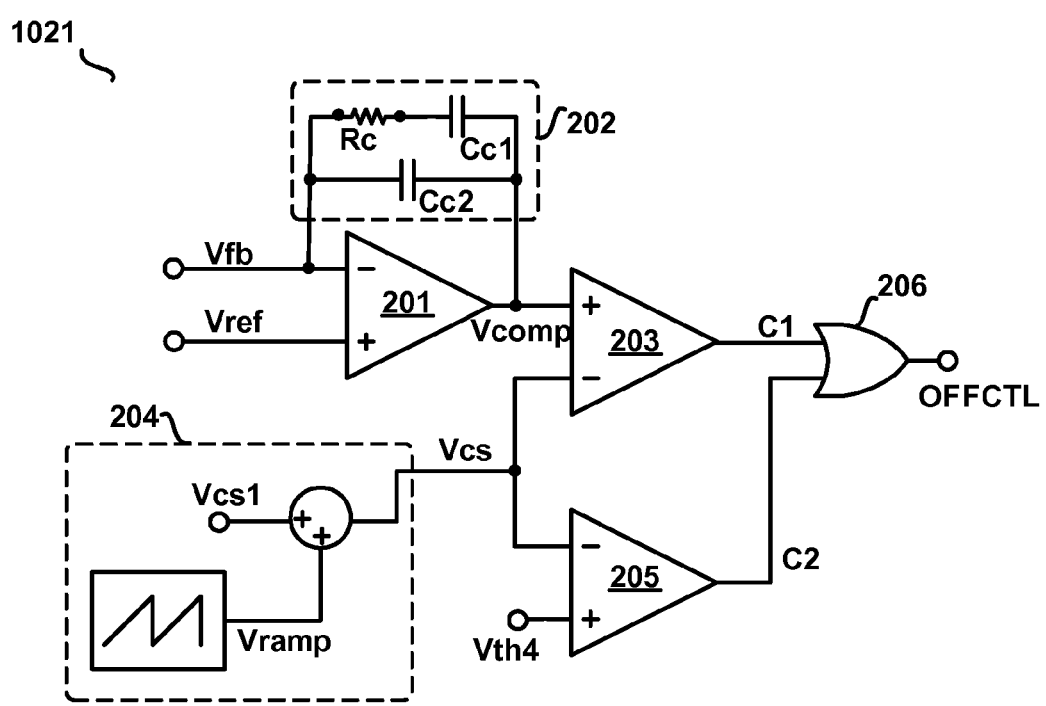
FIG. 8 illustrates a schematic diagram of a pulse width modulation module 1021 in accordance with an alternative embodiment of the present invention.

FIG. 8 illustrates a schematic diagram of the pulse width modulation module 1021 in accordance with an alternative embodiment of the present invention. Components or structures of the pulse width modulation module 1021 in FIG. 8 with substantially the same functions as those of the pulse width modulation module 1021 described previously in conjunction with FIG. 1 are identified by the same reference labels for the sake of simplicity. In the exemplary embodiment of FIG. 8, the pulse width modulation module 1021 may further comprise a ramp compensation module 204, a current limiting module 205 and a logic operation module 206. The ramp compensation module 204 may be configured to receive a current sense signal Vcs2 and a ramp compensation signal Vramp, wherein the current sense signal Vcs2 is proportional to the switching current $I_{HS}$ or the inductor current IL, and wherein the ramp compensation signal Vramp may have a frequency substantially the same as the frequency of the clock signal CLK. The ramp compensation module 204 may further be configured to superpose the current sense signal Vcs2 with the ramp compensation signal Vramp to provide the second feedback signal Vcs. In accordance with an embodiment of the present invention, the control module 102 may further comprise a current sense module (not shown). The current sense module may be electrically coupled to the main switch $M_{HS}$ and to sense the switching current $I_{HS}$ flowing through the main switch $M_{HS}$ so as to provide the current sense signal Vcs2.

The current limiting module 205 may be configured to receive the second feedback signal Vcs and a current limit threshold Vth4, wherein the current limit threshold Vth4 is indicative of a maximum allowable peak value of the switching current $I_{HS}$ and or the inductor current IL. The current limiting module 205 may further be configured to compare the second feedback signal Vcs with the current limit threshold Vth4 and to provide a second comparison signal C2 according to the comparison results. In the example of FIG. 8, the current limiting module 205 may comprise a current limit comparison circuit. The current limit comparison circuit may have a first input terminal (e.g. the "−" input terminal in FIG. 8) configured to receive the second feedback signal Vcs and a second input terminal (e.g. the "+" input terminal in FIG. 8) configured to receive the current limit threshold Vth4. The current limit comparison circuit is configured to compare the second feedback signal Vcs with the current limit threshold Vth4 to provide the second comparison signal C2. In an embodiment, when the second feedback signal Vcs is larger than the current limit threshold Vth4, the second comparison signal C2 generates a narrow pulse to trigger the pulse width modulated signal PWM to switch the main switch $M_{HS}$ off. When the second feedback signal Vcs is smaller than the current limit threshold Vth4, the second comparison signal C2 maintains a low logic level for example and does not trigger the pulse width modulated signal PWM.

The logic operation module 206 may be configured to receive the first comparison signal C1 and the second comparison signal C2, and to operate the first comparison signal C1 with the second comparison signal C2 to generate the off trigger signal OFFCTL, so that the first comparison signal C1 is provided as the off trigger signal OFFCTL when the second feedback signal Vcs is smaller than the current limit threshold Vth4, while the second comparison signal C2 is provided as the off trigger signal OFFCTL when the second feedback signal Vcs is larger than the current limit threshold Vth4. In the example of FIG. 8, the logic operation module 206 is exemplarily illustrated as to comprise an "OR" logic operation circuit. However, this is not intended to be limiting.

Figure 9:
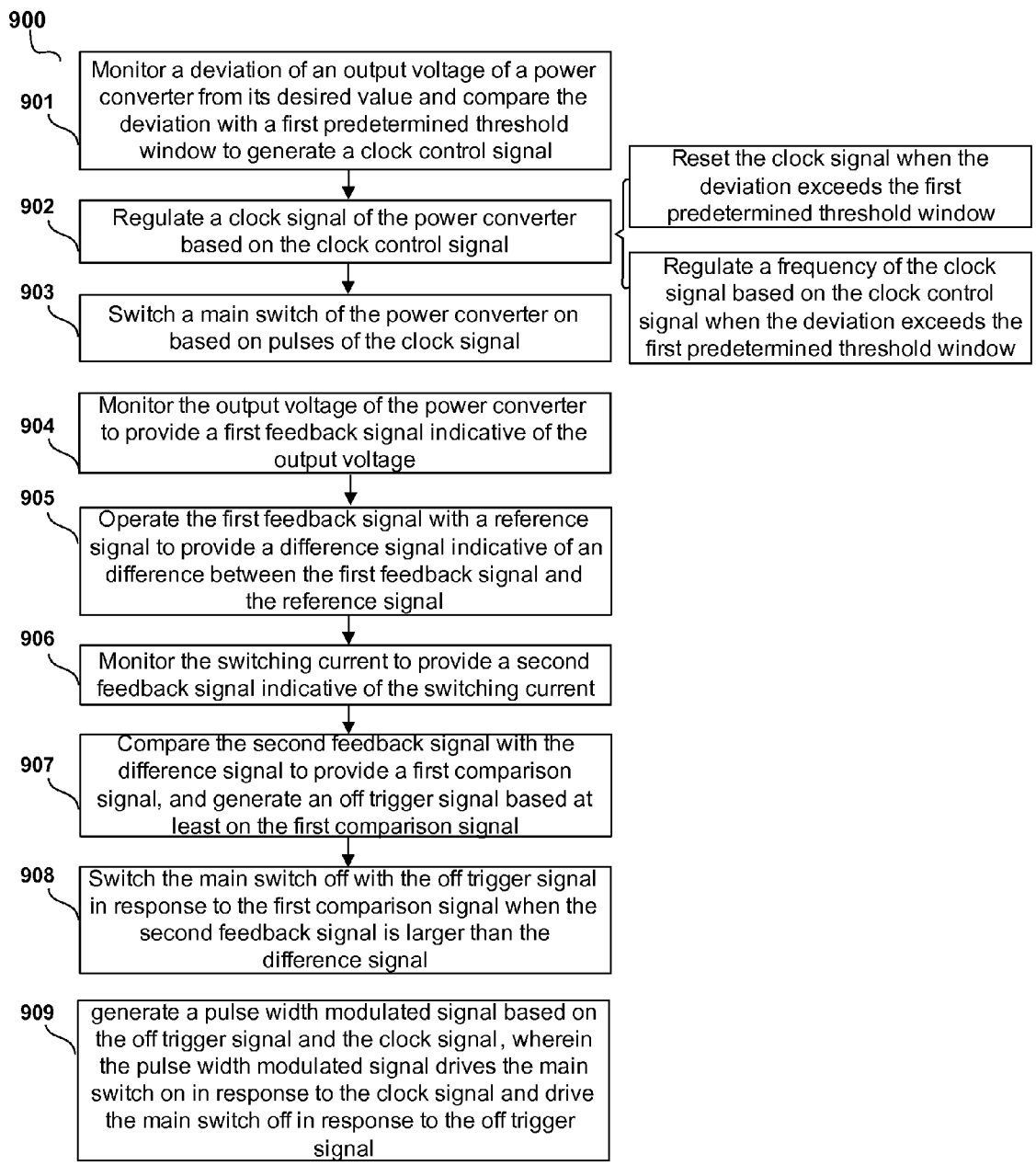
FIG. 9 illustrates a flow chart illustrating a method 900 for controlling a power converter.

FIG. 9 illustrates a flow chart illustrating a method 900 for controlling a power converter. The power converter (e.g. the power converter 100 described with reference to FIGS. 1-8) may comprise a main switch (e.g. the main switch $M_{HS}$ in FIGS. 1-8) and may be configured to convert an input voltage at an input port to an output voltage at an output port, based on driving the main switch to switch on and off. A switching current (e.g. the switching current $I_{HS}$ in FIGS. 1-8) flows through the main switch during the on and off switching of the main switch. The control method 900 may comprise: step 901, monitoring a deviation of the output voltage of the power converter from its desired value, and comparing the deviation with a first predetermined threshold window to generate a clock control signal; step 902, regulating a clock signal of the power converter based on the clock control signal, wherein the clock control signal resets the clock signal when the deviation exceeds the first predetermined threshold window; and step 903, switching the main switch on based on pulses of the clock signal so that power can transmit from the input port to the output port of the power converter.

In accordance with an embodiment of the present invention, the method 900 may further comprise for example at the step 902: regulating a frequency of the clock signal based on the clock control signal when the deviation exceeds the first predetermined threshold window. In an embodiment, regulating the frequency of the clock signal may comprise: increasing the frequency of the clock signal from a first frequency to a second frequency immediately once the deviation exceeds the first predetermined threshold window, then maintaining the frequency of the clock signal at the second frequency for a predetermined duration, and restoring the frequency of the clock signal to the first frequency at the end of the predetermined duration.

In accordance with an embodiment of the present invention, the method 900 may further comprise: step 904, monitoring the output voltage of the power converter to provide a first feedback signal indicative of the output voltage; step 905, operating the first feedback signal with a reference signal indicative of an desired value of the output voltage to provide a difference signal indicative of an difference between the first feedback signal and the reference signal; step 906, monitoring the switching current to provide a second feedback signal indicative of the switching current; step 907, comparing the second feedback signal with the difference signal to provide a first comparison signal, and generating an off trigger signal based at least on the first comparison signal; and step 908, switching the main switch off with the off trigger signal in response to the first comparison signal when the second feedback signal is larger than the difference signal.

In accordance with an embodiment of the present invention, at the step 905, providing the difference signal may comprise: providing an operational amplifier having a first amplifier input terminal and a second amplifier input terminal respectively configured to receive the first feedback signal and the reference signal, and coupling a first compensation resistor and a first compensation capacitor in series between the first amplifier terminal and an amplifier output terminal of the operational amplifier, wherein the amplifier output terminal is configured to provide the difference signal. In this exemplary embodiment, at the step 901, monitoring the deviation of the output voltage from its desired value may comprise monitoring a voltage drop on the first compensation resistor to provide a voltage detection signal indicative of the deviation; generating the clock control signal may comprise comparing the voltage detection signal with a second predetermined threshold window to provide the clock control signal based on the comparison results. At the step 902, if the voltage detection signal exceeds the second predetermined threshold window, it is determined that the deviation exceeds the first predetermined threshold window.

In accordance with an embodiment of the present invention, the method 900 may further comprise: for instance at the step 907, providing a current limit threshold indicative of a maximum allowable peak value of the switching current, comparing the second feedback signal with the current limit threshold to provide a second comparison signal, and the off trigger signal based on the first comparison signal and the second comparison signal. In this exemplary embodiment, the step 908 may correspondingly be modified, for example, if the second feedback signal is larger than the current limit threshold, the off trigger signal is configured to switch the main switch off in response to the first comparison signal, if the second feedback signal is smaller than the current limit threshold, the off trigger signal is configured to switch the main switch off in response to the first comparison signal when the second feedback signal is larger than the difference signal.

In accordance with an embodiment of the present invention, the method 900 may further comprise: for instance at the step 907, operating the first comparison signal with the second comparison signal so that the first comparison signal is provided as the off trigger signal if the second feedback signal is smaller than the current limit threshold, and the second comparison signal is provided as the off trigger signal if the second feedback signal is larger than the current limit threshold.

In accordance with an embodiment of the present invention, the method 900 may further comprise: step 909, generating a pulse width modulated signal based on the off trigger signal and the clock signal, wherein the pulse width modulated signal drives the main switch on in response to the clock signal and drive the main switch off in response to the off trigger signal.

The advantages of the various embodiments of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

We claim:

1. A power converter, comprising:
an input port configured to receive an input voltage;
an output port configured to provide an output voltage;
a switch module comprising a main switch configured to switch on and off in response to a pulse width modulated signal to convert the input voltage into the output voltage; and
a control module having a first control input terminal, a second control input terminal, a third control input terminal and a first control output terminal, wherein the first control input terminal is configured to receive a first feedback signal indicative of the output voltage, and wherein the second control input terminal is configured to receive a second feedback signal indicative of a switching current flowing through the switch module, and wherein the third control input terminal is configured to receive a reference signal indicative of a desired value of the output voltage, and wherein
the control module is configured to provide an off trigger signal based on the first feedback signal, the second feedback signal and the reference signal; and wherein
the control module is further configured to monitor a deviation of the output voltage from the desired value of the output voltage, and to compare the deviation with a first predetermined threshold window to generate a clock control signal, wherein the clock control signal is configured to control the generation of a clock signal, and wherein
the control module is further configured to provide the pulse width modulated signal based on the off trigger signal and the clock signal, wherein the pulse width modulated signal is configured to drive the main switch to switch on in response to the clock signal, and wherein the pulse width modulated signal is configured to drive the main switch to switch off in response to the off trigger signal.

2. The power converter of claim 1, wherein the clock control signal is configured to reset the clock signal once the deviation exceeds the first predetermined threshold window so that the clock signal can immediately trigger the pulse width modulated signal to switch the main switch on.

3. The power converter of claim 1, wherein the clock control signal is configured to vary a frequency of the clock signal during a predetermined duration once the deviation of the output voltage exceeds the first predetermined threshold window.

4. The power converter of claim 3, wherein the clock control signal is configured to increase the frequency of the clock signal from a first frequency to a second frequency immediately once the deviation of the output voltage exceeds the first predetermined threshold window, and to maintain the frequency of the clock signal at the second frequency throughout the predetermined duration, and to regulate and restore the frequency of the clock signal to the first frequency at the end of the predetermined duration.

5. The power converter of claim 3, wherein the clock control signal is configured to increase the frequency of the clock signal from a first frequency to a second frequency immediately once the deviation of the output voltage exceeds the first predetermined threshold window, and to regulate the frequency of the clock signal to gradually decrease from the second frequency to the first frequency throughout the predetermined duration.

6. The power converter of claim 1, wherein the control module further comprises:
a clock module configured to monitor the deviation of the output voltage from the desired value of the output voltage, and to compare the deviation with the first predetermined threshold window to generate the clock control signal, and to generate and regulate the clock signal based on the clock control signal.

7. The power converter of claim 6, wherein the control module further comprises:
an operational amplifier having a first amplifier input terminal configured to receive the first feedback signal, a second amplifier input terminal configured to receive the reference signal, and an amplifier output terminal configured to provide a difference signal indicative of a difference between the first feedback signal and the reference signal; and
a compensation circuit comprising a first compensation resistor and a first compensation capacitor coupled in series between the first amplifier input terminal and the amplifier output terminal; and wherein
the clock module is configured to detect a voltage drop on the first compensation resistor to provide a voltage detection signal indicative of the deviation of the output voltage from its desired value, and to compare the voltage detection signal with a second predetermined threshold window to provide the clock control signal, wherein if the voltage detection signal exceeds the second predetermined threshold window, the clock module is configured to determine that the deviation has exceeded the first predetermined threshold window.

8. A clock module for providing a clock signal to a power converter, wherein the power converter comprises a main switch configured to switch on and off in response to a pulse width modulated signal to convert an input voltage to an output voltage, and wherein the clock module comprising:
a clock control module configured to detect a deviation of the output voltage from a desired value of the output voltage, and to compare the deviation with a first predetermined threshold window to generate a clock control signal; and
a clock generation module configured to generate the clock signal, and further configured to receive the clock control signal and to regulate the clock signal in response to the clock control signal.

9. The clock module of claim 8, wherein the clock generation module is configured to reset the clock signal in response to the clock control signal when the deviation of the output voltage exceeds the first predetermined threshold window.

10. The clock module of claim 8, wherein the clock generation module is configured to vary a frequency of the clock signal in response to the clock control signal during a predetermined duration once the deviation of the output voltage exceeds the first predetermined threshold window.

11. The clock module of claim 8, wherein once the deviation of the output voltage exceeds the first predetermined threshold window, the clock generation module is configured to increase the frequency of the clock signal immediately in response to the clock generation module from a first frequency to a second frequency, and to maintain the frequency of the clock signal at the second frequency throughout the predetermined duration, and to regulate and restore the frequency of the clock signal to the first frequency at the end of the predetermined duration.

12. The clock module of claim 8, wherein once the deviation of the output voltage exceeds the first predetermined threshold window, the clock generation module is configured to increase the frequency of the clock signal immediately in response to the clock control signal from a first frequency to a second frequency and to regulate the frequency of the clock signal to gradually decrease from the second frequency to the first frequency throughout the predetermined duration.

13. The clock module of claim 8, wherein the power converter further comprises:
an operational amplifier having a first amplifier input terminal configured to receive a first feedback signal indicative of the output voltage, a second amplifier input terminal configured to receive a reference signal indicative of the desired value of the output voltage, and an amplifier output terminal configured to provide a difference signal indicative of a difference between the first feedback signal and the reference signal; and
a compensation circuit comprising a first compensation resistor and a first compensation capacitor coupled in series between the first amplifier input terminal and the amplifier output terminal; and wherein
the clock control module is electrically coupled to the compensation circuit to detect a voltage drop on the first compensation resistor and to provide a voltage detection signal indicative of the deviation of the output voltage, and wherein the clock control module is configured to compare the voltage detection signal with a second predetermined threshold window to provide the clock control signal, and wherein the second predetermined threshold window is indicative of the first predetermined threshold window.

14. The clock module of claim 13, wherein the clock control module comprises:
a voltage detection circuit having a first detection input terminal, a second detection input terminal and a detection output terminal, wherein the first detection input terminal is coupled to a first terminal of the first compensation resistor, the second detection input terminal is coupled to a second terminal of the first compensation resistor, and wherein the voltage detection circuit is configured to detect the voltage drop on the first compensation resistor based on the signals detected at the first detection input terminal and the second detection input terminal to provide the voltage detection signal; and
a clock control comparator having a first comparator input terminal, a second comparator input terminal and a comparator output terminal, wherein the first comparator input terminal is configured to receive the voltage detection signal, the second comparator input terminal is configured to receive a second predetermined threshold window, and wherein the clock control comparator is configured to compare the voltage detection signal with the second predetermined threshold window to provide the clock control signal.

15. The clock module of claim 13, wherein the clock control module further comprises:
a comparison circuit having a first comparison input terminal, a second comparison input terminal, a third comparison input terminal and a comparison output terminal, wherein the first comparison input terminal is coupled to the first terminal of the first compensation resistor, the second comparison input terminal is coupled to the second terminal of the first compensation resistor, and the third comparison input terminal is configured to receive the second predetermined threshold window; and wherein
the comparison circuit is configured to directly monitor the voltages at both the first and the second terminals of the first compensation resistor to provide the voltage detection signal and to compare the voltage detection signal with the second predetermined threshold window so as to provide the clock control signal.

16. The clock module of claim 8, wherein the clock generation module comprises:
a first current source configured to provide a first constant current;
an oscillation capacitor having a first capacitor terminal and a second capacitor terminal, wherein the first capacitor terminal is coupled to the first current source to receive the first constant current, the second capacitor terminal is connected to a reference ground;
an oscillation comparator having a first comparator input terminal, a second comparator input terminal and a comparator output terminal, wherein the first comparator input terminal is electrically coupled to the first capacitor terminal of the oscillation capacitor to detect a capacitor voltage, the second comparator input terminal is configured to receive a comparison threshold, and wherein the oscillation comparator is configured to compare the capacitor voltage with the comparison threshold to provide the clock signal;
a first oscillation switch having a first switch terminal, a second switch terminal and a switch control terminal, wherein the first switch terminal is electrically coupled to the first capacitor terminal of the oscillation capacitor, the second switch terminal is connected to the reference ground, and the switch control terminal is electrically coupled to the comparator output terminal of the oscillation comparator to receive the clock signal; and wherein the first oscillation switch is driven to switch on when the clock signal is at high logic level, and is driven to switch off when the clock signal is at low logic level;
a second current source configured to provide a second constant current, wherein the second constant current is larger than the first constant current; and
a second oscillation switch having a third switch terminal, a fourth switch terminal and a second switch control terminal, wherein the third switch terminal is electrically coupled to the second current source to receive the second constant current, the fourth switch terminal is electrically coupled to the first capacitor terminal of the oscillation capacitor, and the second switch control terminal is configured to receive the clock control signal; and wherein if the deviation exceeds the first predetermined threshold window, the clock control signal is configured to drive the second oscillation switch to switch on and thus connecting the second current source to the first capacitor terminal of the oscillation capacitor.

17. A method for controlling a power converter, wherein the power converter comprising a main switch configured to switch on and off to convert an input voltage to an output voltage; and wherein the method comprising:
monitoring a deviation of the output voltage from its desired value, and comparing the deviation with a first predetermined threshold window to generate a clock control signal;
regulating a clock signal of the power converter based on the clock control signal; and
switching the main switch on based on pulses of the clock signal.

18. The method of claim 17, wherein regulating the clock signal comprises: resetting the clock signal in response to the clock control signal when the deviation exceeds the first predetermined threshold window.

19. The method of claim 17, wherein regulating the clock signal comprises: regulating a frequency of the clock signal based on the clock control signal when the deviation exceeds the first predetermined threshold window.

20. The method of claim 17, wherein regulating the clock signal comprises: increasing the frequency of the clock signal from a first frequency to a second frequency immediately once the deviation exceeds the first predetermined threshold window, then maintaining the frequency of the clock signal at the second frequency for a predetermined duration, and restoring the frequency of the clock signal to the first frequency at the end of the predetermined duration.

* * * * *